United States Patent [19]
Bradley

[11] 4,016,481
[45] Apr. 5, 1977

[54] UNMATCHED FIELD EFFECT TRANSISTORS PROVIDING MATCHED VOLTAGE-CONTROLLED RESISTANCES

[75] Inventor: Stevan D. Bradley, East Palo Alto, Calif.

[73] Assignee: GTE Automatic Electric Laboratories Incorporated, Northlake, Ill.

[22] Filed: Nov. 26, 1975

[21] Appl. No.: 635,459

[52] U.S. Cl. .............................. 323/16; 307/237; 307/304; 323/22 R; 330/39
[51] Int. Cl.² ...................... H03G 3/30; H04B 1/10
[58] Field of Search ............ 323/16, 22 R; 338/13, 338/22 SD; 330/145, 29; 307/304, 237; 328/171

[56] References Cited
UNITED STATES PATENTS

| 3,748,495 | 7/1973 | Messinger | 307/237 |
| 3,904,975 | 9/1975 | Satoh | 328/171 |
| 3,944,853 | 3/1976 | Cooper | 328/171 |

OTHER PUBLICATIONS

Siliconix Inc. Application Note "FET's as Voltage–Controlled Resistors" by D. Capella; Feb. 1973, pp. 1–12.
*Electronic Design*, Sept. 13, 1965; pp. 66–69, "FET's as Voltage–Variable Resistors" by C. D. Todd.
*Solid State Design*, Aug. 1965, pp. 12–14, "FET's as Voltage Controlled Resistors" by J. S. Sherwin.
*Proc. of IEEE* Oct. 1968, pp. 1718–1719, "Reducing Distortion in Controlled Attenuators Using FET" by H. P. von Ow.
*IEEE Trans. on Audio*, Sept./Oct. 1965, vol. AU–13, No. 5, pp. 112–120.
*Teledyne S.C. Manual*, June 1972, pp. 95–96, "Junction FET's Theory & Applications".

*Primary Examiner*—Gerald Goldberg
*Attorney, Agent, or Firm*—Russell A. Cannon; Leonard R. Cool

[57] ABSTRACT

Matched voltage-controlled resistances are provided across the drain-to-source channels of a pair of FET's, each FET having a gate electrode connected through an associated control resistor to the same one terminal of a source of DC control voltage; having a source electrode electrically connected to the same other terminal of the voltage source; and having an associated feedback resistor electrically connected between its drain and gate electrodes. The drain electrodes are preferably capacitively coupled to input or output terminals to prevent DC loading of the FET network by external circuitry. A resistor is also connected across the drain-to-source channel of each FET to limit the maximum value of net resistance presented thereby. The resistance of one of the control resistors is adjusted to have a value which causes the net drain-to-source resistance of the associated FET to have the same value as that of the other FET for a particular value of control voltage. The net drain-to-source resistances of the two FET's are then closely matched over a range of control voltages.

10 Claims, 3 Drawing Figures

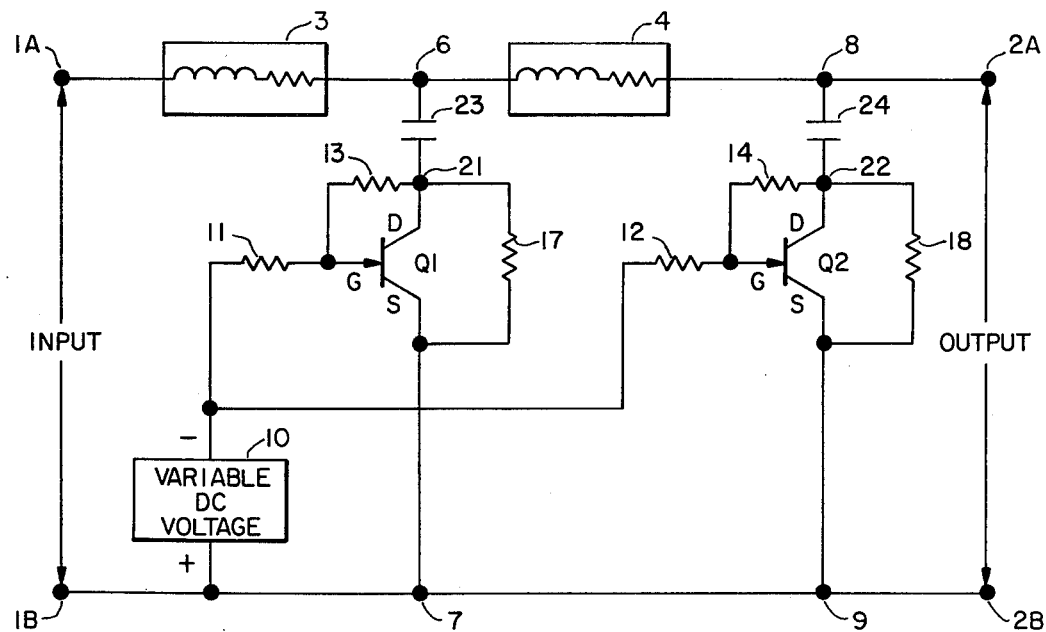
*FIG. 1*
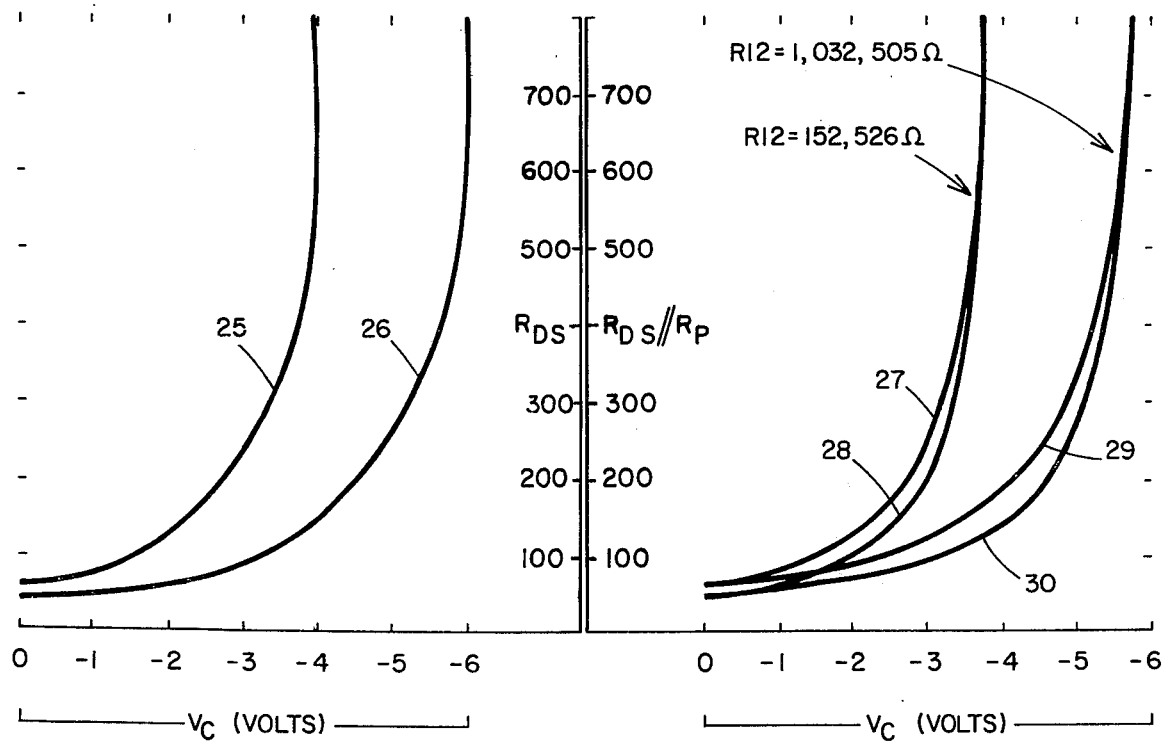
*FIG. 2*      *FIG. 3*

UNMATCHED FIELD EFFECT TRANSISTORS PROVIDING MATCHED VOLTAGE-CONTROLLED RESISTANCES

BACKGROUND OF INVENTION

This invention relates to voltage-controlled resistors and more particularly to unmatched field effect transistors (FET's) providing matched voltage-controlled resistances.

The use of a single FET as a voltage-controlled resistor is described in the article, "FET's As Voltage-Variable Resistors" by Carl D. Todd, Electronic Design, Sept. 13, 1965, pp. 66–69. In such applications, the FET drain-to-source voltage is restricted to be less than the pinch-off voltage such that it operates in the so-called triode region below the knee of the performance characteristics of the FET ($I_D$ vs. $V_{DS}$, with $V_{GS}$ constant). The pinch-off voltage $V_{GSO}$ may be defined as the gate-to-source voltage that reduces the drain current to 0.01 of its zero bias value, the drain being maintained at a positive potential with respect to the source which is greater than the magnitude of the pinch-off voltage. The FET performance characteristics are generally symmetrical through the origin. The relationship between drain current $I_D$ and drain-to-source $V_{DS}$ is approximately linear over a limited range of this current and voltage, where the channel pinch-off conditions are not too closely approximated and the gate-to-source channel is reverse biased. Thus, the FET operates in this limited region as a voltage-controlled variable resistor to a small AC signal that is applied across the drain-to-source channel thereof.

A cascaded attenuator using a pair of FET's as variable resistors is described in a Siliconix application note, "FET's As Voltage-Controlled Resistors" by Dave Capella and carrying the date February 1973. The circuit including the cascaded attenuator there is purely resistive, i.e., it does not include any reactive elements. This prior-art attenuator circuit is similar to the circuit in FIG. 1, except that the elements in the boxes 3 and 4 are purely resistive and that it does not include the other resistors in FIG. 1. Although this prior-art attenuator provides a variable resistance which is a function of a control voltage, the resistances provided by individual FET's there are not matched and need not be matched for proper operation of the circuit. More specifically, the FET's do not normally each present the same drain-to-source channel resistance for the same control voltage over a range of control voltages. In a circuit such as in FIG. 1 which includes reactive elements in the boxes 3 and 4, it is desirable that the resistances provided by the FET's be matched, i.e., that each FET present the same drain-to-source resistance for a given control voltage. The matching is necessary in this instance to provide a predictable family of circuit responses by applying the appropriate control voltage. Since the characteristics of FET's vary considerably between units, FET's having similar characteristics must be individually selected for use in such applications. Such a selection process is time consuming and expensive. Although pairs of selected FET's that are matched within 5% over a range of resistances are commercially available, such a matched pair of FET's may cost an order of magnitude more than unmatched FET's.

An object of this invention is the provision of matched voltage-controlled resistors with unmatched FET's.

SUMMARY OF INVENTION

Matched voltage controlled resistances are provided across the drain-to-source channels of a pair of FET's, each of which has a source of DC control voltage connected across one of its gate-to-source and gate-to-drain channels. One FET has its gate electrode connected to the voltage source through a control resistor and to the one of its source-and-drain electrodes not associated with the voltage source through a feedback resistor. The ones of the FET source-and-drain electrodes which are not associated with the voltage source are preferably capacitively coupled to input and output terminals, respectively. The resistance of the control resistor is adjusted to have a value which causes the net drain-to-source resistance of the one FET to be equal to the net drain-to-source resistance of the other FET for a particular control voltage. These net drain-to-source resistances of the two FET's are closely matched over a range of control voltages.

DESCRIPTION OF DRAWINGSS

FIG. 1 is a schematic circuit diagram of an embodiment of this invention;

FIG. 2 is graphs of typical drain-to-source resistances of a pair of unmatched FET's as a function of control voltage $V_C$; and FIG. 3 is graphs of the parallel combination of drain-to-source resistances of the unmatched FET's yielding the curves in FIG. 2 and associated limiting resistors 17 and 18 when the FET's are connected in the embodiment of this invention in FIG. 1.

DESCRIPTION OF PREFERRED EMBODIMENT

Referring now to FIG. 1, a circuit embodying this invention comprises input and output ports having one terminals 1A and 2A electrically connected together through impedance elements 3 and 4 and having other terminals 1B and 2B directly electrically connected together. The impedance elements 3 and 4, which are not part of this invention, may each comprise the series combination of an inductor and a resistor in an adjustable filter network embodying this invention. Since the loss in such a filter network is reactive and therefore not the same at all frequencies, it is desirable to present variable resistances between nodes 6 and 7 and nodes 8 and 9, which are closely matched over a range of resistances in order that the network have a predictable loss for an appropriate control voltage. Randomly mismatched variable resistances would not assure that a particular desired response could be achieved at any control voltage. An FET operating in the so-called triode or non-saturation region provides a drain-to-source resistance which varies as a function of a control voltage that is applied to the gate-to-source channel thereof. A pair of FET's have matched drain-to-source resistances where the drain-to-source resistance of one FET is substantially equal to the drain-to-source resistance of the other FET over a range of control voltages.

In accordance with this invention, variable resistances between nodes 6 and 7 and nodes 8 and 9 are provided by the circuit in FIG. 1 comprising a pair of FET's Q1 and Q2 which are shown here for illustrative purposes as N channel devices. Each FET has a source electrode electrically connected to the positive terminal of a source 10 of DC control voltage $V_C$, has a gate electrode electrically connected through an associated one of the control resistors 11 and 12 to the negative terminal of the DC voltage source, and has a drain electrode electrically connected to its gate electrode through an associated one of the feedback resistors 13 and 14. DC circuits are provided across the drain-to-source channels of Q1 and Q2 by associated resistors 17 and 18. The resistors 11 – 14 reduce distortion in the FET circuits which is caused by the fact that the drain current versus drain-to-source voltage (for constant gate-to-source voltage) characteristics of the FET's are neither perfectly linear in the triode region nor perfectly symmetrical in the first and third quadrants of representations thereof. The resistances of the feedback and control resistors 13 and 11 in conventional circuits are normally quite large, in the order of 500 kilohms. Although these resistors may have the same values of resistance, this is not essential. The resistances of resistors 17 and 18 are preferably much less than that of resistors 11 – 14, e.g., in the order of 4 kilohms. These resistors 17 and 18 limit the maximum value of the net resistance presented between nodes 6 and 7 and nodes 8 and 9, respectively. In order to prevent external circuitry that is connected to input and output terminals from connecting a DC path across nodes 6 and 7 or nodes 8 and 9 and loading the FET circuit, the Q1 and Q2 drain electrodes are preferably capacitively coupled to input terminal 1A and output terminal 2A through DC blocking capacitors 23 and 24, respectively.

Considering only the FET Q1 and associated elements in FIG. 1, for example, the drain-to-source resistance $R_{DS}$ between the drain and source electrodes of an FET varies as a function of the gate-to-source voltage $V_{GS}$ thereof and is representable as $$R_{DS} = \frac{R_{DSO}}{1 - V_{GS}/V_{GSO}} \quad (1)$$

where $R_{DSO}$ is a constant which is the minimum drain-to-source resistance for a gate-to-source voltage of 0 volts, and $V_{GSO}$ is a constant which is the pinch-off voltage of the FET. The resistors 11, 13, and 17 are essentially electrically connected in series across the DC voltage source 10. Since the resistance of resistor 17 is much less than that of resistors 11 and 13, the voltage drop across the drain-to-source channel of Q1 is very low. This means that the drain electrode of Q1 is essentially at the same potential as its source electrode. The resistors 11 and 13 therefore essentially divide down the DC control voltage $V_C$ of source 10 such that $$V_{GS} = V_C \frac{R_F}{R_F + R_C} \quad (2)$$

where $R_C$ represents the resistance of control resistor 11 and $R_F$ represents the resistance of feedback resistor 13. Assuming that resistors 11 and 13 both have the same values of resistance, the gate-to-source voltage of Q1 is representable as $$V_{GS} = V_C/2. \quad (3)$$

Substituting equation (3) in equation (1) reveals that the drain-to-source resistance $R_{DS}$ of an FET is a function of the control voltage $V_C$.

For the same type of FET, the constants $V_{GSO}$ and $R_{DSO}$ of particular transistors vary greatly from device to device. This causes different FET's of the same type to have different values of drain-to-source resistance $R_{DS}$ for the same value of control voltage $V_C$. FIG. 2 is a plot of the drain-to-source resistance $R_{DS}$ defined by equations (1) and (3) for two different FET's. Curve 25 corresponds to an FET having an $R_{DSO} = 64$ ohms and a $V_{GSO} = -2$ volts. Curve 26 corresponds to an FET having an $R_{DSO} = 47$ ohms and a $V_{GSO} = -3$ volts. These curves in FIG. 2 provide an indication of the degree of mismatch between the drain-to-source resistances $R_{DS}$ of particular FET's of the same type. There is considerable difference between the drain-to-source resistances of these two FET's, particularly for control voltages between $-3$ volts and $-6$ volts.

The resistances $R_{N1}$ and $R_{N2}$ between nodes 7 and 21 and nodes 9 and 22, respectively, are equal to the parallel combinations of particular FET drain-to-source resistances and associated resistances $R_P$ of resistors 17 and 18. In accordance with this invention, the resistance $R_C = R12$ of control resistor 12 is selected to make the two FET's Q1 and Q2 provide the same resistances $R_{N1}$ and $R_{N2}$ between nodes 7 and 21 and between nodes 9 and 22 for some value of control voltage $V_C$. Proper selection of the resistance R12 then yields closely matched values of the resistances $R_{N1}$ and $R_{N2}$ over a range of control voltages. This result occurs because the proper resistance of resistor 12 causes a particular value of control voltage $V_C$ to present different gate-to-source bias voltages on Q1 and Q2. This effectively causes the curve 26 in FIG. 2, for example, to be shifted to the left until curves 25 and 26 coincide for a particular value of drain-to-source resistance $R_{DS}$ and control voltage $V_C$.

The value of the control voltage $V_C$ for which the net resistances $R_{N1}$ and $R_{N2}$ associated with Q1 and Q2 are the same value may be computed by substituting equation (3) in equation (1), selecting a desired value of the net resistance $R_{N1} = R_{DS1} \parallel R_P$, and solving for $V_C$, to obtain the relationship $$V_C = \frac{2V_{GSO1}}{R_{N1}R_P}(-R_{DSO1} R_P + R_{N1} R_{DSO1} + R_{N1} R_P), \quad (5)$$

where $R_P = R17 = R18$. The required resistance R12 of resistor 12 that is needed to make the resistances $R_{N1}$ and $R_{N2}$ associated with Q1 and Q2 the same value is computed by substituting equation (2) in equation (1) and solving for the control resistance $R_C = R12$ to obtain the relationship $$R12 = -R14 - \frac{R_{N2} R14 R_P V_C}{V_{GSO2}(R_{DSO2} R_P - R_{N2} R_{DSO2} - R_{N2} R_P)} \quad (6)$$

where $R_P = R17 = R18$, and $R_F = R14$. Combining equations (5) and (6) provides an expression for the desired value of the resistance R12 of resistor 12. In practice, the net resistance $R_{N1}$ associated with Q1 is measured and set to a predetermined value by varying the control voltage $V_C$. The resistance of resistor 12 is then varied to make the net resistance $R_{N2}$ associated with Q2 equal to the predetermined value of resistance $R_{N1}$ for the corresponding value of control voltage.

The curves 27 and 28 in FIG. 3 are plots of the net resistances $R_{N1}$ and $R_{N2}$ where the FET devices associated with curves 25 and 26 correspond to the elements Q1 and Q2, respectively, in FIG. 1. The resistances $R_P$ of resistors 17 and 18 in this example are 4 kilohms. The resistance $R_C$ of control resistor 12 is selected here to make the node resistances $R_{N1}$ and $R_{N2}$ both equal to 700 ohms, which is on the vertical portion of the curves in FIG. 3. The curves 29 and 30 are similar plots of the node resistances $R_{N1}$ and $R_{N2}$ with the devices related to curves 25 and 26 as being switched, i.e., where the FET element associated with curves 25 and 26 corresponds to Q2 and Q1, respectively. The node resistances $R_{N1}$ and $R_{N2}$ in FIG. 3 are closely matched over a range of control voltages.

What is claimed is:

1. Apparatus providing first and second voltage-controlled resistances between associated first and second pairs of nodes thereof which are matched over a range of control voltages, comprising:

first and second field effect transistors (FET's) having gate electrodes, having drain electrodes electrically connected to first nodes of associated first and second pairs of nodes, and having source electrodes electrically connected to second nodes of associated first and second pairs of nodes, each of said FET's having a drain-to-source channel resistance that is variable as a function of a voltage that is applied across one of the gate-to-source and gate-to-drain channels thereof;

a source of DC control voltage having first and second terminals;

means electrically connecting the first terminal of said voltage source to one of the source and drain electrodes of each of said FET's and electrically connecting the second terminal of said voltage source to the gate electrode of said first FET;

a first resistor electrically connected across the channel of said second FET gate electrode and the other one of the source and drain electrodes of said second FET; and a second resistor electrically connected between the second terminal of said voltage source and the gate electrode of said second FET, said second resistor having a resistance causing the resistances across the first and second pairs of nodes to be the same value for a prescribed common control voltage measured across the terminals of said voltage source and causing the resistance across the second pair of nodes to be substantially equal to the resistance across the first pair of nodes over a range of control voltages.

2. Apparatus according to claim 1 wherein said connecting means includes a third resistor in the electrical connection of the second terminal of said voltage source to the gate electrode of said first FET.

3. Apparatus according to claim 2 including a fourth resistor electrically connected across the channel between said first transistor gate electrode and the other one of the source and drain electrodes of said first FET.

4. Apparatus according to claim 3 including fifth and sixth resistors electrically connected across the drain-to-source channels of associated first and second FET's.

5. Apparatus according to claim 4 wherein the nodes of the pairs thereof that are associated with the other ones of the drain-and-source electrodes of said first and second FET's are coupled to external circuitry through associated first and second Dc blocking capacitors.

6. Apparatus according to claim 1 including a third resistor electrically connected across the drain-to-source channel of said second FET.

7. Apparatus according to claim 6 wherein said connecting means includes a fourth resistor in the electrical connection of the second terminal of said voltage source to the gate electrode of said first FET.

8. Apparatus according to claim 7 including a fifth resistor electrically connected across the junction between said first FET gate electrode and the other one of the source and drain electrodes of said first FET.

9. Apparatus according to claim 8 including a sixth resistor electrically connected across the drain-to-source channel of said first FET.

10. Apparatus according to claim 9 wherein the nodes of said first and second pairs thereof which are associated with the other ones of the drain and source electrodes of said first and second FET's are electrically connected to external circuitry through first and second DC blocking capacitors, respectively, the first and second voltage-controlled resistances being the parallel combinations of the drain-to-source resistances of said first and second FET's and the resistances of said sixth and third resistors, respectively.

* * * * *